(12) United States Patent
Breitwisch et al.

(10) Patent No.: US 8,378,328 B2
(45) Date of Patent: Feb. 19, 2013

(54) PHASE CHANGE MEMORY RANDOM ACCESS DEVICE USING SINGLE-ELEMENT PHASE CHANGE MATERIAL

(75) Inventors: Matthew J. Breitwisch, Yorktown Heights, NY (US); Chieh-Fang Chen, Panchiao (TW); Yi-Chou Chen, HsinChu (TW); Chung H. Lam, Peekskill, NY (US); Simone Raoux, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 643 days.

(21) Appl. No.: 12/036,215

(22) Filed: Feb. 22, 2008

(65) Prior Publication Data

US 2009/0212274 A1 Aug. 27, 2009

(51) Int. Cl.
*H01L 29/02* (2006.01)
*H01L 47/00* (2006.01)

(52) U.S. Cl. .. 257/2; 257/3; 257/4; 257/5; 257/E29.002; 257/E47.001

(58) Field of Classification Search .................. 257/2–5, 257/E29.002, E29.003, E29.006, E47.001
See application file for complete search history.

(56) References Cited

U.S. PATENT DOCUMENTS

| | | | | |
|---|---|---|---|---|
| 7,453,081 B2 * | 11/2008 | Happ et al. | | 257/3 |
| 7,807,989 B2 * | 10/2010 | Lee et al. | | 257/2 |
| 8,193,029 B2 * | 6/2012 | Lee | | 438/95 |
| 2005/0173691 A1 * | 8/2005 | Lee et al. | | 257/2 |
| 2007/0210348 A1 * | 9/2007 | Song et al. | | 257/246 |
| 2009/0057643 A1 * | 3/2009 | Chen | | 257/4 |

* cited by examiner

*Primary Examiner* — Allison P Bernstein
(74) *Attorney, Agent, or Firm* — Ido Tuchman; Vazken Alexanian

(57) ABSTRACT

A phase change memory cell with a single element phase change thin film layer; and a first electrode and a second electrode coupled to the single element phase change thin film layer. A current flows from the first electrode to the single element phase change thin film layer, and through to the second electrode. The single element phase change thin film layer includes a single element phase change material. The single element phase change thin film layer can be less than 5 nanometers thick. The temperature of crystallization of the single element phase change material can be controlled by its thickness. In one embodiment, the single element phase change thin film layer is configured to be amorphous at room temperature (25 degrees Celsius). In one embodiment, the single element phase change thin film layer is comprised of Antimony (Sb).

16 Claims, 4 Drawing Sheets

PHASE CHANGE MEMORY RANDOM ACCESS DEVICE USING SINGLE-ELEMENT PHASE CHANGE MATERIAL

PARTIES TO A JOINT RESEARCH AGREEMENT

International Business Machines Corporation, a New York corporation; Macronix International Corporation, Ltd., a Taiwan corporation, are parties to a Joint Research Agreement.

BACKGROUND OF THE INVENTION

1. Field of the Invention

The present invention is directed toward computer memory, and more particularly to phase change memory utilizing phase change materials.

2. Description of Background

There are two major groups in computer memory: non-volatile memory and volatile memory. Constant (or nearly constant) input of energy in order to retain information is not necessary in non-volatile memory but is required in the volatile memory. Thus, non-volatile memory devices contain memory in which the state of the memory elements can be retained for days to decades without power consumption. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM). Examples of volatile memory devices include Dynamic Random Access Memory (DRAM) and Static Random Access Memory (SRAM).

The present invention is directed to phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common semiconductors in the group used to produce a chalcogenide when creating a phase change memory cell. Examples of this would be Ge2Sb2Te5 (GST), Sb2Te3, and In2Se3. However, problems arise in multi-element phase change materials with repeated read-write phase change cycles. The phase change materials may phase segregate, undergo local variations in stoichiometry, and in the case of doped phase change materials the dopant atoms may redistribute themselves. Thus it is desirable to devise a solution to prevent problems associated with repeated phase change cycles in phase change memory devices.

SUMMARY OF THE INVENTION

One exemplary aspect of the present invention is a memory cell. The memory cell is comprised at least in part of a single element phase change thin film layer comprised of a single element phase change material. The single element phase change material is comprised of a single chemical element (i.e., a single type of atom). The single element phase change material exists in at least two phases at room temperature having different levels of resistivity. Additionally, the single element phase change material has a relatively low resistivity crystalline phase and a relatively high resistivity amorphous phase. The memory cell also includes a first electrode and a second electrode coupled to the single element phase change thin film layer such that current passes from the first electrode to the single element phase change thin film layer and through to the second electrode.

The single element phase change thin film layer can be, but is not limited to, Antimony (Sb), Tellurium (Te), Selenium (Se), Bismuth (Bi), and Tin (Sn). The single element phase change thin film layer can maintain the amorphous phase at room temperature (approximately 25 degrees Celsius) and is less than 5 nanometers thick. Additionally, the temperature at which phase change occurs from amorphous to crystalline of the single element phase change thin film layer is dependent on the thickness of the single element phase change thin film layer.

Another exemplary aspect of the present invention is a memory array comprising one or more memory cells, with at least one of the memory cells comprising, at least in part, a single element phase change thin film layer comprised of a single element phase change material. The single element phase change material exists at least two phases at room temperature having different levels of resistivity. Additionally, the single element phase change material has a relatively low resistivity crystalline phase and a relatively high resistivity amorphous phase. The memory cell also includes a first electrode and a second electrode coupled to the single element phase change thin film layer such that current passes from the first electrode to the single element phase change thin film layer and through to the second electrode.

The single element phase change thin film layer can be, but is not limited to, Antimony (Sb), Tellurium (Te), Selenium (Se), Bismuth (Bi), and Tin (Sn). The single element phase change thin film layer is also amorphous at room temperature (approximately 25 degrees Celsius) and approximately less than 5 nanometers thick. Additionally, the temperature at which phase change occurs from amorphous to crystalline of the single element phase change thin film layer is dependent on the thickness of the single element phase change thin film layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
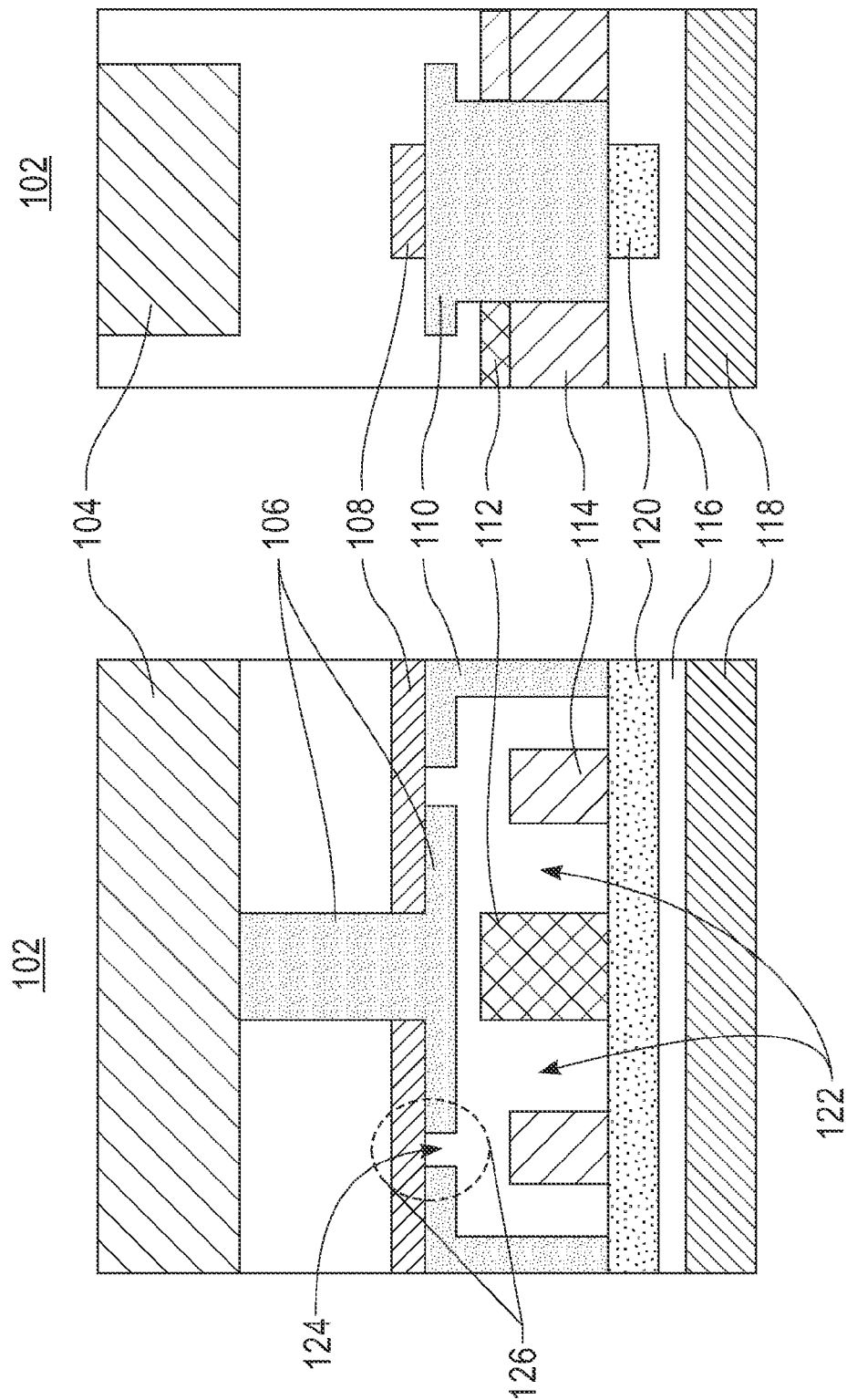
FIG. 1 illustrates a single element phase change thin film layer implemented in a thin film bridge memory cell.

The present invention is described with reference to embodiments of the invention. Throughout the description of the invention reference is made to FIGS. 1-4. When referring to the figures, like structures and elements shown throughout are indicated with like reference numerals.

As described in detail below, an aspect of the present invention is a single element phase change thin film layer used as a phase change layer for a phase change memory (PCM) cell, array, and integrated circuit. Advantages of the aforementioned single element phase change thin film layer are that the single element phase change thin film layer does not require doping where dopants may redistribute themselves within the phase change layer and does not suffer from the effects of phase segregation within the phase change layer occurring in multi-element phase change materials. These phenomena are present with repeated read-write cycles in multi-element phase change layers resulting in unpredictable resistivity in the multi-element phase change layers thus limiting the number of phase change cycles of a particular phase change memory cell.

In FIG. 1A, an exemplary embodiment of the present invention is presented as a thin film bridge memory cell 102. The view is shown along a bit line 104 of the thin film bridge memory cell 102. The thin film bridge memory cell 102 is comprised of the bit line 104, a bit line via and bridge contact (first electrode) 106, the single element phase change thin film layer 108, a drain via and bridge contact (second electrode) 110, a common source 112, a word line 114, an insulating layer 116, a substrate 118, an insulating region 122, and active silicon region 120 (shown in FIG. 1B). FIG. 1B illustrates the thin film bridge memory cell 102 along the word line 114 of the thin film bridge memory cell 102. Note that the single element phase change thin film layer 108 may be implemented in a variety of different memory cell geometries known to those skilled in the art such as, but not limited to, thin film ring memory cells, thin film ring memory cells with pillar and insulating spacers, and thin film spacer ring memory cells. As used herein, the term "thin film layer" is defined as a structure in which at least one dimension of the structure perpendicular to the direction of the current path through the structure is less than 5 nm. Thus, a thin film layer as used herein may include, but is not limited to, structures such as a narrow cylinder and a narrow annulus.

In FIGS. 1A and 1B, the substrate 118 is located at the bottom of the thin film bridge memory cell 102. In this particular embodiment of the invention, the insulating layer 116 is formed directly above the substrate 118. The active silicon region 120 is formed within the insulating layer 116. Those skilled in the art will recognize that a variety of standard processes may be implemented in forming the insulating layer 116 and active silicon region 120 above the substrate 118. The insulating layer 116 can be a variety of different insulating materials such as, but not limited to, silicon dioxide or silicon nitride. The substrate 118 is usually but not limited to, bare silicon. Additionally, those skilled in the art will recognize that a variety of different substrate 118, insulating layer 116, and active silicon region 120 configurations may be used for the thin film memory cell 102.

As shown in FIGS. 1A and 1B, the word line 114 and the common source 112 are formed above the insulating layer 116 and connected to the active silicon region 120 in this exemplary embodiment of the invention. The bit line via and bridge contact 106 is connected to the single element phase change thin film layer 108 and the drain via and bridge contact 110, these three elements along with a gap 124 form a bridge region/transistor 126 for the thin film bridge memory cell 102. The common source 112 in this particular embodiment of the invention serves as a first electrode in the thin film bridge memory cell 102. The drain via and contact 110 serve as a second electrode in the thin film bridge memory cell 102. In this particular embodiment of the invention, the gap 124 is continuous with the insulating region 122. The gap 124 and the insulating region 122 isolate the current to the desired structures when current is applied. Additionally, the gap 124 and the insulating region 122 can be comprised of, but not limited to, silicon dioxide.

The single element phase change thin film layer 108 formation in the bridge region 126 requires a careful cleaning etch step prior to the formation such as, but not limited to an argon ion etch or sputter cleaning. The processes used for forming a single element phase change thin film layer 108 may include, but is not limited to, sputter deposition, evaporation techniques, laser ablation, chemical vapor deposition (CVD), atomic layer deposition (ALD), and electroplating deposition. In one embodiment of the invention, the single element phase change thin film layer 108 is deposited using sputter deposition.

Again, those skilled in the art will recognize a variety of different standard techniques used to form the bit line via and bridge contact 106, the drain via and bridge contact 110, the word line 114, and the common source 112. In one particular embodiment of the invention, the common source 112 can be comprised of, but not limited to, tungsten (W). The word line 114 can be comprised of, but not limited to, polycrystalline silicon. The drain via 110 can be comprised of, but not limited to tungsten (W), and the bridge contact 110 can be comprised of, but not limited to titanium nitride. A gap 124 between the bridge contact 110 and the bit line via and bridge contact 106, and above the word line 114 can be comprised of any insulating material such as, but not limited to, silicon nitride or silicon dioxide.

The current applied to modify the resistivity or read resistivity of the single element phase change thin film layer 108 flows from the common source 112, through the active silicon region 120, to and through the drain via and bridge contact 110, through the single element phase change thin film layer 108, over the gap 124, and to the bit line via and bridge contact 106. The bit line via and bridge contact 106 are connected with the bit line 104 in this exemplary embodiment of the invention. Again, the implementation of the single element phase change thin film layer 108 is not limited to memory cells containing the bridge transistor 126.

An alternate embodiment of the invention is the thin film ring memory cell. In this configuration there is a top conductive electrode and a bottom conductive electrode, and connecting the two electrodes is a thin (approximately less than 5 nanometers) cylinder of single element phase change material. The cylinder of single element phase change material is filled with a first insulating region. A second insulating region surrounds the cylinder of single element phase change material. In this particular embodiment of the invention, the top electrode also serves as the bit line for the thin film ring memory cell.

The single element phase change thin film layer is comprised of a single element phase change material. The single element phase change material is a single chemical element (i.e. a single type of atom). Examples of single element phase change materials are, but not limited, Antimony (Sb), Tellurium (Te), Selenium (Se), Bismuth (Bi), and Tin (Sn). In one embodiment of the invention, the limiting factors for the single element phase change material are that the single element phase change thin film layer is less than 5 nanometers thick, the single element phase change material can retain its amorphous state below 25 degrees Celsius, and the temperature of crystallization is controlled by modifying the thickness of the single element phase change material. As stated above, the single element phase change thin film layer can exist in many different configurations. In one particular embodiment of the invention, the single element phase change thin film layer is simply a thin film of single element phase change material. In another embodiment of the invention, the single element phase change thin film layer is a narrow cylinder or a narrow annulus. The only limiting factor is that the structure of the single element phase change thin film layer is that at least one dimension of the single element phase change thin film layer is less than approximately 5 nanometers thick. As stated above, a variety of processes may be utilized in forming the single element phase change thin film layer.

Figure 2:
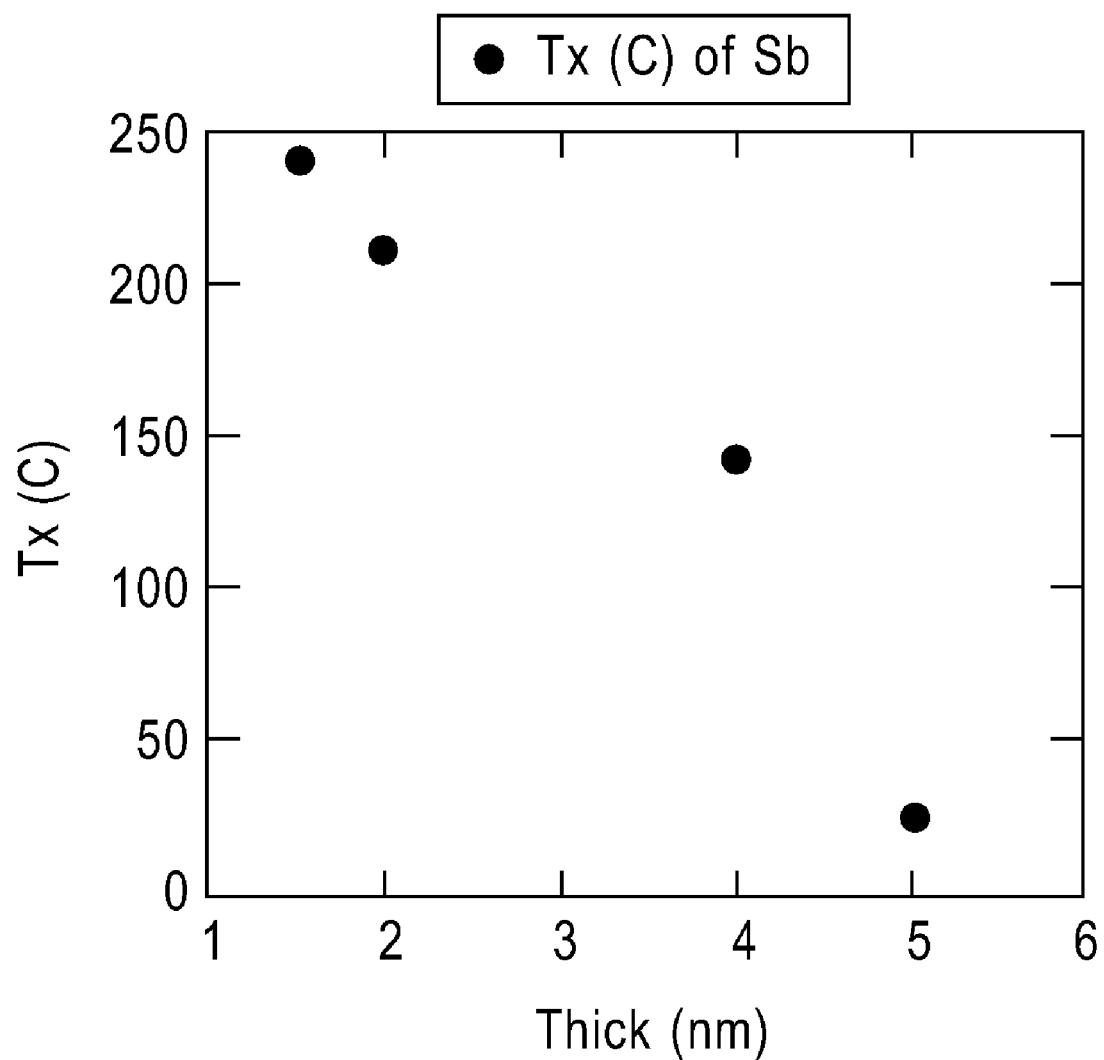
FIG. 2 illustrates crystallization temperature as a function of single element phase change thin film thickness.

Turning to FIG. 2, a graph of temperature of crystallization 202 is illustrated for one particular embodiment where Antimony is the single element phase change material. As illustrated, the temperature of crystallization is dependent on the thickness of the single element phase change material thin film layer. At 5 nanometers the temperature of crystallization is approximately 25 degrees Celsius. This means at approximately room temperature a 5 nanometer thick single element phase change thin film layer of Antimony is crystalline. If the thickness of the single element phase change thin film layer of Antimony is decreased to 4 nanometers the temperature of crystallization is approximately 145 degrees Celsius and the Antimony can be amorphous at room temperature (approximately 25 degrees Celsius) until a sufficient current has been applied to crystallize the Antimony. The phase of the single element phase change thin film layer of Antimony can be manipulated at room temperature for a thickness of less than 5 nanometers. The temperatures of crystallization vary according to the material utilized for a particular memory cell. Thus the thickness of the single element phase change thin film layer is selected according to the material and the temperature desired for crystallization.

Figure 3:
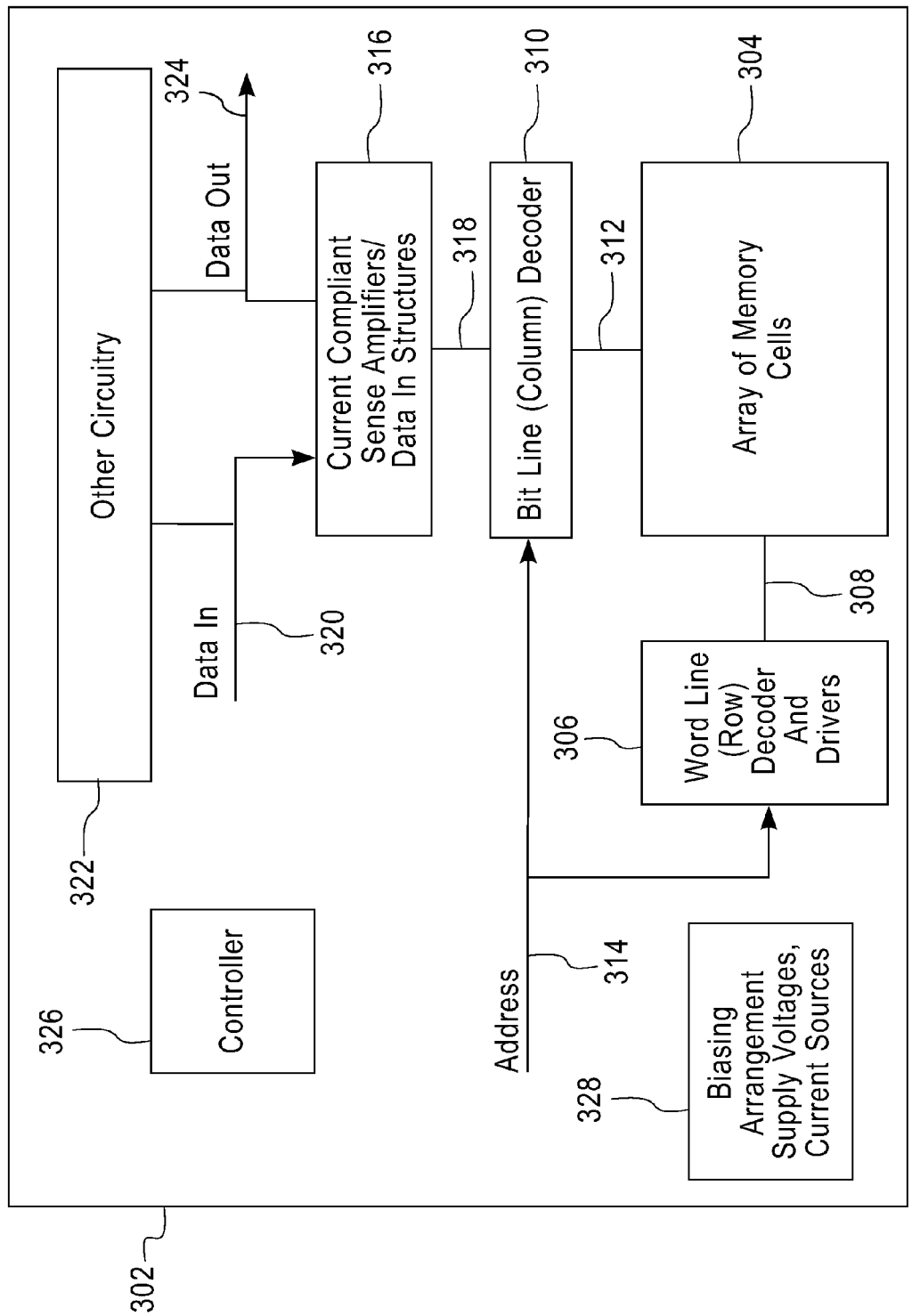
FIG. 3 is a simplified block diagram of an integrated circuit including a memory array implemented using phase change memory cells as described herein.

FIG. 3 is a simplified block diagram of an integrated circuit 302 including a memory array 304 implemented using phase change memory cells as described herein. A word line (or row) decoder 306 is coupled to, and in electrical communication with, a plurality of word lines 308, and arranged along rows in the memory array 304. A bit line (column) decoder 310 is coupled to and in electrical communication with a plurality of bit lines 312 arranged along columns in the memory array 304 for reading data from, and writing data to, the phase change memory cells in the memory array 304. Addresses are supplied on bus 314 to the word line decoder 306 and the bit line decoder 310. Sense amplifiers and data-in structures in block 316, including current sources for the read, set and reset modes, are coupled to the bit line decoder 310 via data bus 318. Data is supplied via the data-in line 320 from input/output ports on the integrated circuit 302 or from other data sources internal or external to the integrated circuit 302, to the data-in structures in block 316. In the illustrated embodiment, other circuitry 322 is included on the integrated circuit 302, such as a general purpose processor, special purpose application circuitry, or a combination of modules providing system-on-a-chip functionality supported by the phase change memory cell array. Data is supplied via the data-out line 324 from the sense amplifiers in block 316 to input/output ports on the integrated circuit 302, or to other data destinations internal or external to the integrated circuit 302.

A controller 326 implemented for example using a state machine, controls the application of bias arrangement supply voltages and current sources 328, such as read, program erase, erase verify, program verify voltages or currents for the word lines and bit lines, and controls the word line/source line operation using an access control process. The controller 326 can be implemented using special purpose logic circuitry as known in the art. In alternative embodiments, the controller 326 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 326.

Figure 4:
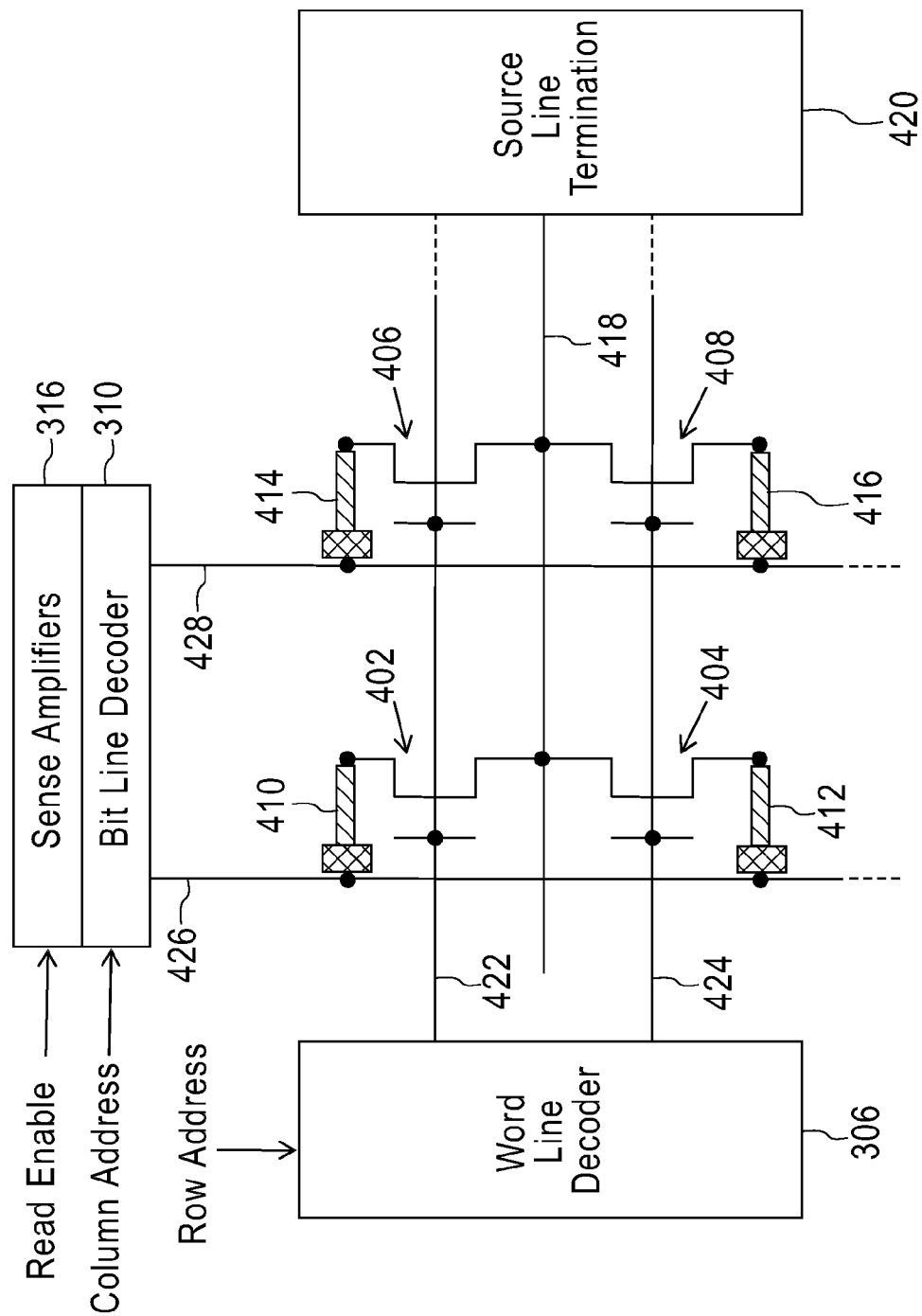
FIG. 4 is a partial schematic of a representative memory array as shown in FIG. 3.

As shown in FIG. 4, each of the memory cells of array 304 (shown in FIG. 3) includes an access transistor (or other access device such as a diode), four of which are shown as 402, 404, 406, 408 and single element phase change material thin film layers 410, 412, 414, 416. Sources of each of access transistors 402, 404, 406, 408 are connected in common to a source line 418 that terminates in a source line termination 420. In other embodiments, the access transistors are replaced using diodes between the word lines and the memory cells. In another embodiment, the source lines of the select devices are not electrically connected, but are independently controllable. A plurality of word lines 308 including word lines 422 and 424 extend parallel along a first direction. The word lines 422 and 424 are in electrical communication with the word line decoder 306. The gates of access transistors 402 and 406 are connected to a common word line, such as the word line 422, and the gates of access transistors 404 and 408 are connected in common to the word line 424. A plurality of bit lines including bit lines 426 and 428 are shown. The single element phase change material thin film layer 410 is connected between the drain of access transistor 402 and the bit line 426, and the single element phase change material thin film layer 412 is connected between the drain of access transistor 404 and the bit line 426. Similarly, the single element phase change material thin film layer 414 is connected between the drain of access transistor 406 and the bit line 428, and the single element phase change material thin film layer 416 is connected between the drain of access transistor 408 and the bit line 428. It should be noted that four memory cells are shown for convenience of discussion but, in practice, array 304 may comprise thousands to millions of such memory cells. Also, other array structures may be used.

Having described preferred embodiments for single element phase change thin film memory cells (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A memory cell, the memory cell comprising:
a single element phase change thin film layer comprising a single element phase change material, the single element phase change thin film layer having a plurality of phases with different levels of resistivity, the plurality of phases including a low resistivity crystalline phase and a high resistivity amorphous phase; and
a first electrode and a second electrode electrically coupling the single element phase change thin film layer such that current passes from the first electrode to the single element phase change thin film layer and through to the second electrode;
wherein the thickness of the single element phase change thin film layer is less than 5 nanometers and results in a temperature at which phase change occurs from the high resistivity amorphous phase to the low resistivity crystalline phase of the single element phase change thin film layer to be at least 25 degrees Celsius and is dependent on the thickness of the single element phase change thin film layer.

2. The memory cell of claim 1, wherein crystallization temperature of the single element phase change material is controlled by modifying the thickness of the single element phase change thin film layer.

3. The memory cell of claim 1, wherein the single element phase change thin film layer can maintain an amorphous phase at a temperature of at least 25 degrees C.

4. The memory cell of claim 1, wherein the single element phase change material is Antimony (Sb).

5. The memory cell of claim 1, wherein the single element phase change material is Tellurium (Te).

6. The memory cell of claim 1, wherein the single element phase change material is Selenium (Se).

7. The memory cell of claim 1, wherein the single element phase change material is Bismuth (Bi).

8. The memory cell of claim 1, wherein the single element phase change material is Tin (Sn).

9. A memory array, the memory array comprised of one or more memory cells, at least one memory cell comprising:
a single element phase change thin film layer comprising a single element phase change material, the single element phase change thin film layer having a plurality of phases with different levels of resistivity, the plurality of phases including low resistivity crystalline phase and a high resistivity amorphous phase; and
a first electrode and a second electrode electrically coupling the single element phase change thin film layer such that current passes from the first electrode to the single element phase change thin film layer and through to the second electrode;
wherein the thickness of the single element phase change thin film layer is less than 5 nanometers and results in a temperature at which phase change occurs from the high resistivity amorphous phase to the low resistivity crystalline phase of the single element phase change thin film layer to be at least 25 degrees Celsius and is dependent on the thickness of the single element phase change thin film layer.

10. The memory array of claim 9, wherein crystallization temperature of the single element phase change material is controlled by modifying the thickness of the single element phase change thin film layer.

11. The memory array of claim 9, wherein the single element phase change thin film layer can maintain an amorphous phase at a temperature of at least 25 degrees C.

12. The memory array of claim 9, wherein the single element phase change material is Antimony (Sb).

13. The memory array of claim 9, wherein the single element phase change material is Tellurium (Te).

14. The memory array of claim 9, wherein the single element phase change material is Selenium (Se).

15. The memory array of claim 9, wherein the single element phase change material is Bismuth (Bi).

16. The memory array of claim 9, wherein the single element phase change material is Tin (Sn).

* * * * *